United States Patent
Mo et al.

(10) Patent No.: US 9,252,736 B2
(45) Date of Patent: Feb. 2, 2016

(54) NETWORK SIGNAL COUPLING AND EMI PROTECTION CIRCUIT

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: AJOHO ENTERPRISE CO., LTD., Taipei (TW)

( * ) Notice: Subject to any disclaimer, the term of this patent is extended or adjusted under 35 U.S.C. 154(b) by 246 days.

(21) Appl. No.: 13/907,413

(22) Filed: May 31, 2013

(65) Prior Publication Data

US 2014/0009238 A1 Jan. 9, 2014

Related U.S. Application Data

(63) Continuation-in-part of application No. 13/544,538, filed on Jul. 9, 2012, now Pat. No. 8,878,628.

(30) Foreign Application Priority Data

Feb. 4, 2013 (TW) .............................. 102202379 U

(51) Int. Cl.
  *H03H 7/38* (2006.01)
  *H03H 7/00* (2006.01)
  *H05K 1/02* (2006.01)

(52) U.S. Cl.
  CPC ............. *H03H 7/004* (2013.01); *H05K 1/0231* (2013.01); *H05K 1/0245* (2013.01)

(58) Field of Classification Search
  CPC ... H05H 7/004; H03K 1/0254; H03K 1/0233; H03H 7/004; H05K 1/0254; H05K 1/0233

USPC .................................................... 333/131, 12
See application file for complete search history.

(56) References Cited

U.S. PATENT DOCUMENTS

| | | | | |
|---|---|---|---|---|
| 3,681,612 A * | 8/1972 | Vogl et al. | ...................... | 307/105 |
| 4,761,623 A * | 8/1988 | Schneider | ...................... | 333/167 |
| 8,230,400 B2 * | 7/2012 | Horn et al. | ...................... | 717/129 |
| 2011/0059694 A1 * | 3/2011 | Audic | .......................... | 455/41.1 |
| 2013/0278355 A1 * | 10/2013 | Shibata | .......................... | 333/181 |

* cited by examiner

*Primary Examiner* — Robert Pascal
*Assistant Examiner* — Kimberly Glenn
(74) *Attorney, Agent, or Firm* — Muncy, Geissler, Olds & Lowe, P.C.

(57) ABSTRACT

A network signal coupling and EMI protection circuit assembly includes a processing circuit installed in a circuit board and coupled between a voltage-mode network-on-chip at the circuit board and a network connector and drivable by a driving voltage from the voltage-mode network-on-chip to process network signals. The processing circuit includes opposing first connection end and second connection end, two-wire channels electrically connected between the first connection end and the second connection end, a coupling module and an EMI protection module installed in each two-wire channel for coupling network signals and removing noises. Each EMI protection module includes two capacitors having respective first ends thereof respectively connected to the two wires of the respective two-wire channel and respective opposite second ends thereof connected in series and grounded for filtering lower frequency part of resonant waves in the band during signal transmission to prevent electromagnetic interference and to enhance signal transmission stability.

10 Claims, 7 Drawing Sheets

NETWORK SIGNAL COUPLING AND EMI PROTECTION CIRCUIT

This application is a Continuation-In-Part of application Ser. No. 13/544,538, filed on Jul. 9, 2012, for which priority is claimed under 35 U.S.C. §120, the entire contents of which are hereby incorporated by reference.

This application claims the priority benefit of Taiwan patent application number 102202379, filed on Feb. 4, 2013.

BACKGROUND OF THE INVENTION

1. Field of the Invention

The present invention relates to network technology and more particularly, to a network signal coupling and EMI protection circuit, which uses a processing circuit with coupling modules and EMI protection modules to isolate electricity and to absorb resonant waves, enhancing network signal coupling performance and network signal transmission stability.

2. Description of the Related Art

Following fast development of computer technology, desk computers and notebook computers are well developed and widely used in different fields for different applications. It is the market trend to provide computers having high operating speed and small size. Further, network communication technology brings people closer, helping people to gather information about living, learning, working and recreational activities. By means of network communication, people can communicate with one another to send real time information, advertising propaganda or e-mail. Further, through the internet, people can search information, send instant messages, or play on-line video games. The development of computer technology makes the relationship between people and network unshakable and inseparable.

Connecting a computer or electronic apparatus to a network for data transmission can be done by a cable connection technique or a wireless transmission protocol. A cable connection technique needs the installation of a network connector. A conventional network connector has built therein transformer modules and common-mode suppression modules. As shown in FIG. 5, a conventional network connector comprises a circuit board A, and multiple transformer coils B and filter coils C installed in the circuit board A. Each of the transformer coils B and filter coils C comprises a wire core D, and a lead wire D1 wound round the wire core D with the ends thereof bonded to respective contacts at the circuit board A. Because the winding of the transformer coils B and the filter coils C cannot be achieved by an automatic machine and must be done by labor, the fabrication efficiency of this kind of network connector is low. Further, the lead wire may be broken easily during winding, thereby increasing the cost. Further, fabrication by labor cannot accurately control the coil winding tightness and number of turns, affecting product quality stability.

Further, following the development of network application technology, network data transmission capacity has been greatly increased. To satisfy the demand for high data transmission capacity, network transmission speed has been greatly improved from the early 10 Mbps to 100 Mbps or 1 Gbps. Nowadays, fiber-optic network transmission speed can be as high as 10 Gbps and up. A transformer coil B is an inductor, the impedance (Z) of an inductor is an inductive reactance, and its unit is ohm (Ω). The inductive reactance is calculated subject to the equation of $Z=2\pi \cdot f \cdot L$, in which: f=frequency and its unit is hertz (Hz); L=inductance of inductor and its unit is Henry (H). The aforesaid network connector utilizes the characteristic of the inductance of the transformer coils B to isolate electricity and to couple signals. In order to transmit signals from the primary side to the secondary side, each transformer coil B must have a predetermined inductance. From the above equation, it is known that inductive reactance is directly proportional to the working frequency and the inductance of the inductor. When increasing the signal frequency, the inductance reactance will be relatively increased (see the comparative curve of frequency and inductance reactance based on a 350 μH capacitor shown in FIG. 6). However, increased inductive reactance causes increased signal attenuation, leading to network disconnection or dramatic slowdown in network transmission speed. As shown in FIG. 7, when the insertion loss of the transformer reaches ~3 db, the response frequency becomes 0.45 MHz~240 MHz. When over this range, the insertion loss will increase rapidly. Therefore, the working frequency must be controlled within a relatively narrower bandwidth. Further, subject to the characteristic curve of the transformer coils B of low frequency with low intensity, middle frequency with high intensity and high frequency with low intensity, when the network transmission speed reaches 1 Gbps, the signal intensity of the transformer coils B will be lowered, unable to meet the product requirements.

Therefore, there is a strong demand for a network signal coupling and EMI protection circuit assembly, which eliminates the drawbacks of instable quality, high cost, automated production incapability and low signal intensity under a high network transmission speed of the prior art network connector design.

SUMMARY OF THE INVENTION

The present invention has been accomplished under the circumstances in view. It is therefore the main object of the present invention to provide a network signal coupling and EMI protection circuit assembly, which uses coupling modules to isolate electricity and EMI protection modules to absorb resonant waves, enhancing signal coupling performance and network signal transmission stability.

To achieve this and other objects of the present invention, a network signal coupling and EMI protection circuit assembly in accordance with the present invention comprises a voltage-mode network-on-chip, a network connector, and a processing circuit electrically coupled between the voltage-mode network-on-chip and the network connector and drivable by a driving voltage outputted by the voltage-mode network-on-chip to process network signals. The processing circuit comprises opposing first connection end and second connection end respectively electrically connected to the voltage-mode network-on-chip and the network connector, a coupling module installed in each two-wire channel between the opposing first connection end and second connection end for isolating electricity and coupling network signals, and an EMI protection module installed in each two-wire channel between the opposing first connection end and second connection end for absorbing a lower frequency party of resonant waves in the band to prevent electromagnetic interference, enhancing signal coupling performance and signal transmission stability.

Further, each EMI protection module comprises two second capacitors connected in series between the two wires of the respective two-wire channel. The two second capacitors have the respective one ends thereof respectively electrically connected to the two wires of the respective two-wire channel and respective other ends thereof connected in series and grounded. This circuit design of the present invention simply uses regular electronic components that can be directly bonded to a circuit board by an automatic machine without wire winding by labor, facilitating component quality control, improving the product yield and suitable for mass process to reduce the manufacturing cost.

DETAILED DESCRIPTION OF THE PREFERRED EMBODIMENT

Figure 1:
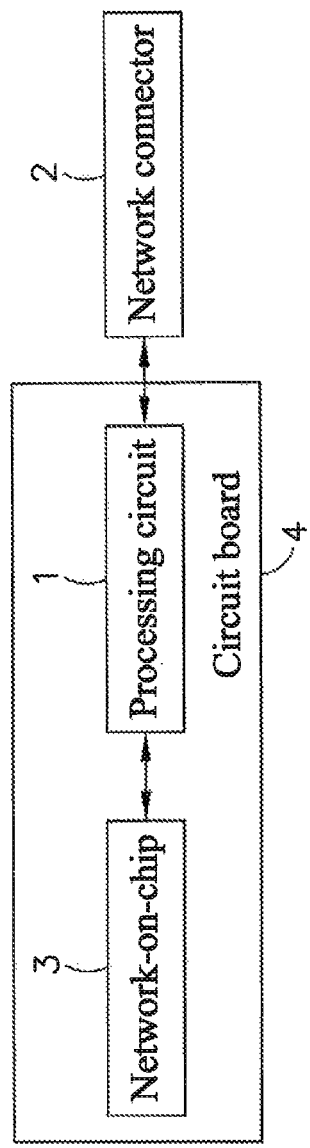
FIG. 1 is a block diagram of a network signal coupling and EMI protection circuit assembly in accordance with the present invention.
Figure 2:
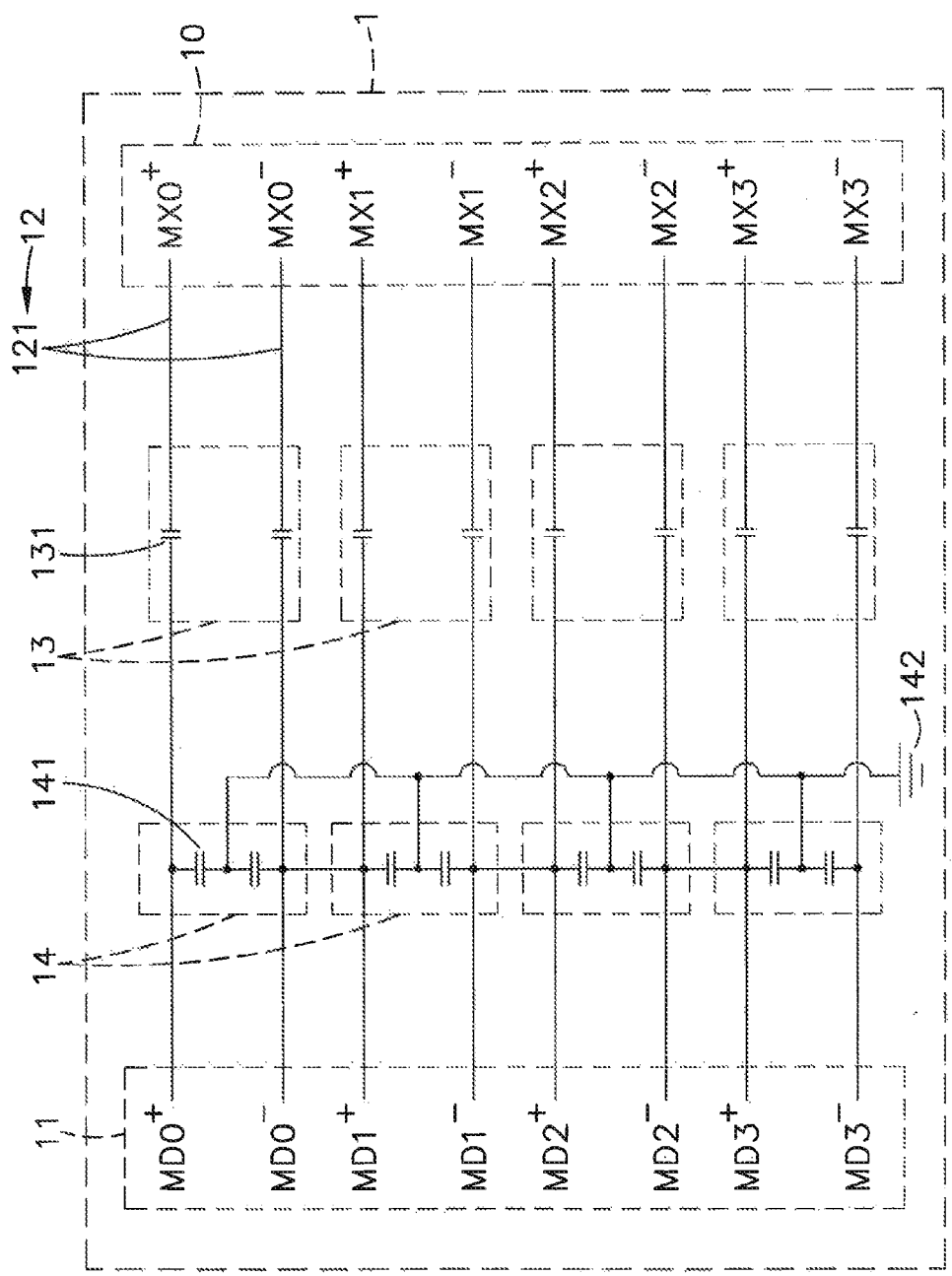
FIG. 2 is a circuit diagram of the processing circuit of the network signal coupling and EMI protection circuit assembly in accordance with the present invention.
Figure 3:
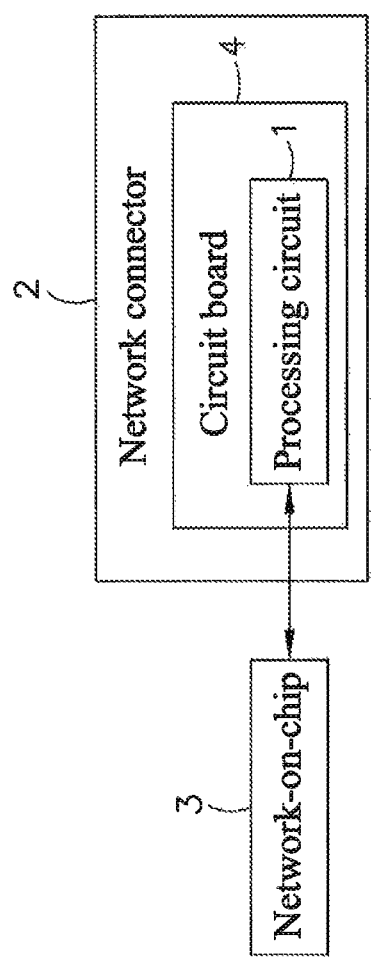
FIG. 3 is an alternate form of the block diagram of the network signal coupling and EMI protection circuit assembly in accordance with the present invention.
Figure 4:
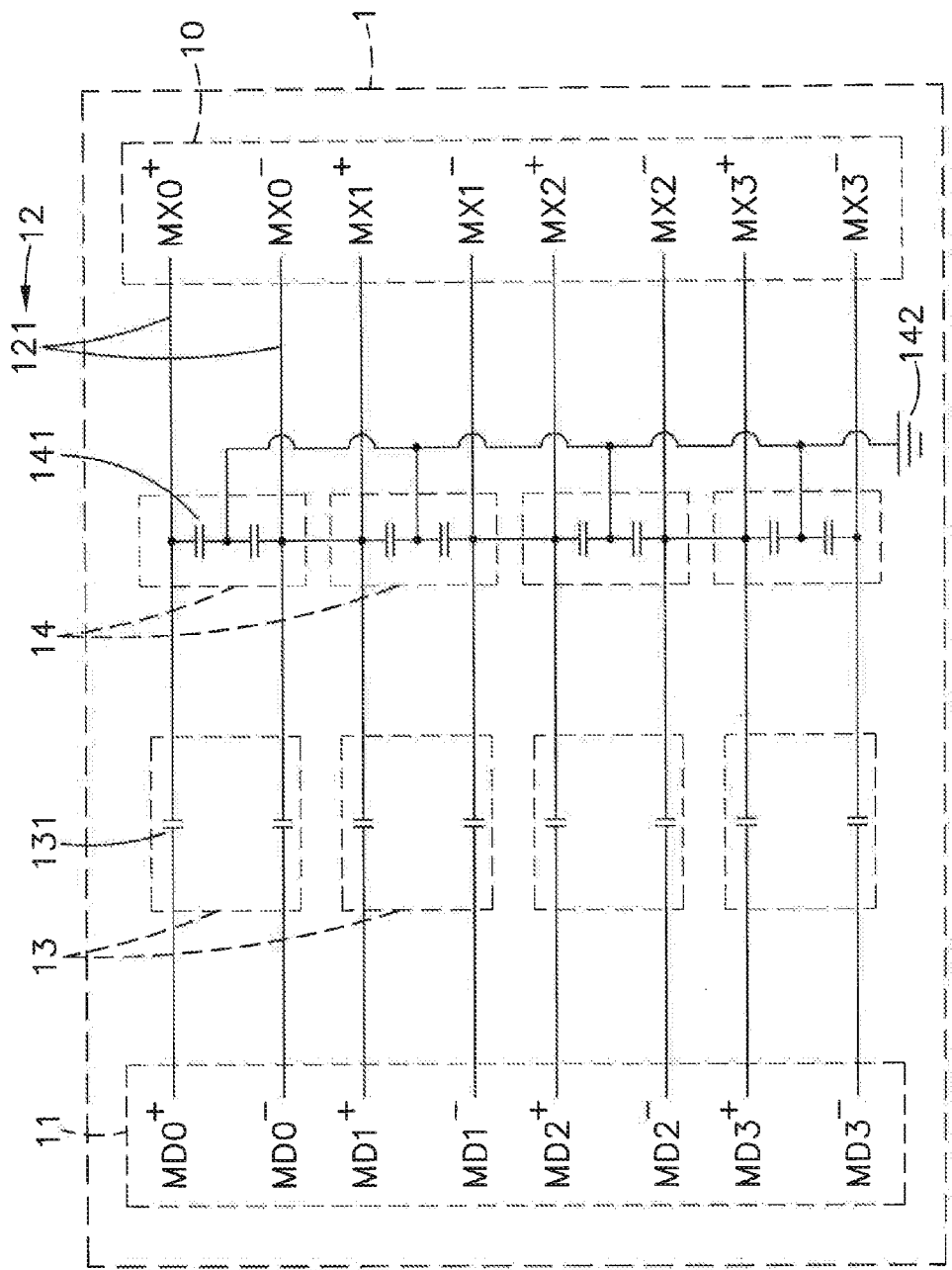
FIG. 4 is a circuit diagram of an alternate form of the processing circuit of the network signal coupling and EMI protection circuit assembly in accordance with the present invention.
Figure 5:
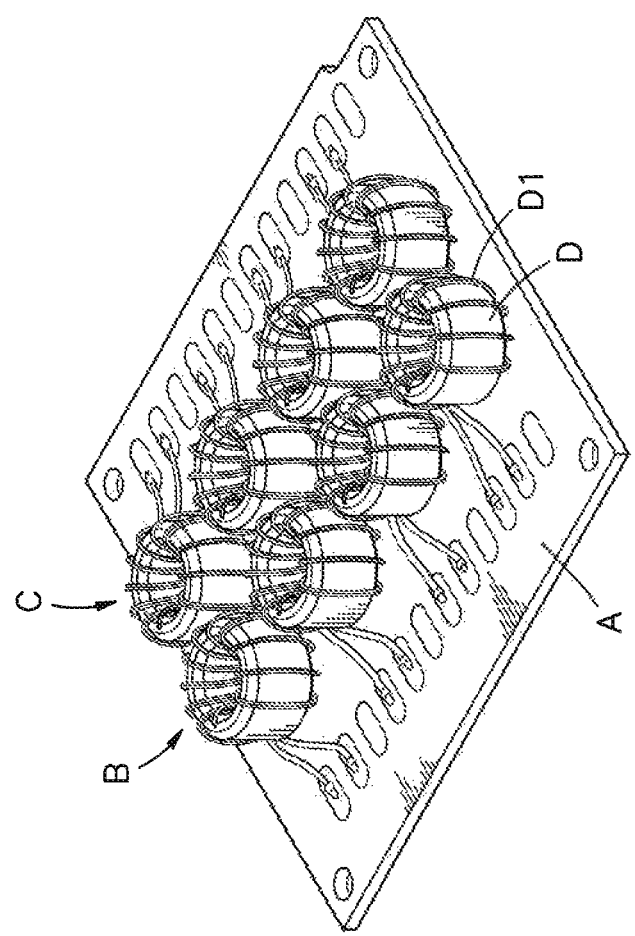
FIG. 5 illustrates the arrangement of transformer coils and filter coils on a circuit board according to the prior art.
Figure 6:
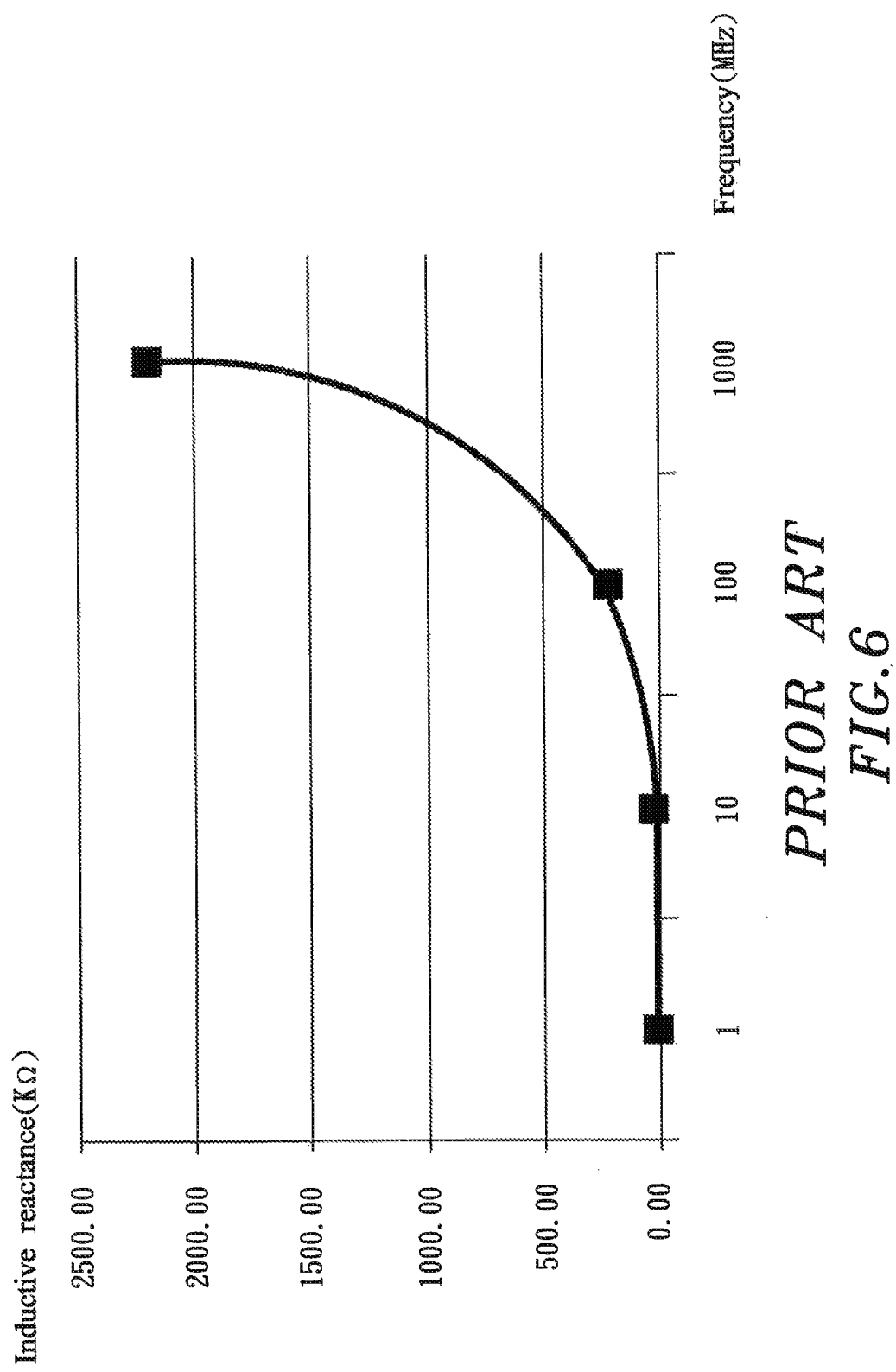
FIG. 6 is an inductive reactance-frequency curve obtained from a network signal processed through the prior art design.
Figure 7:
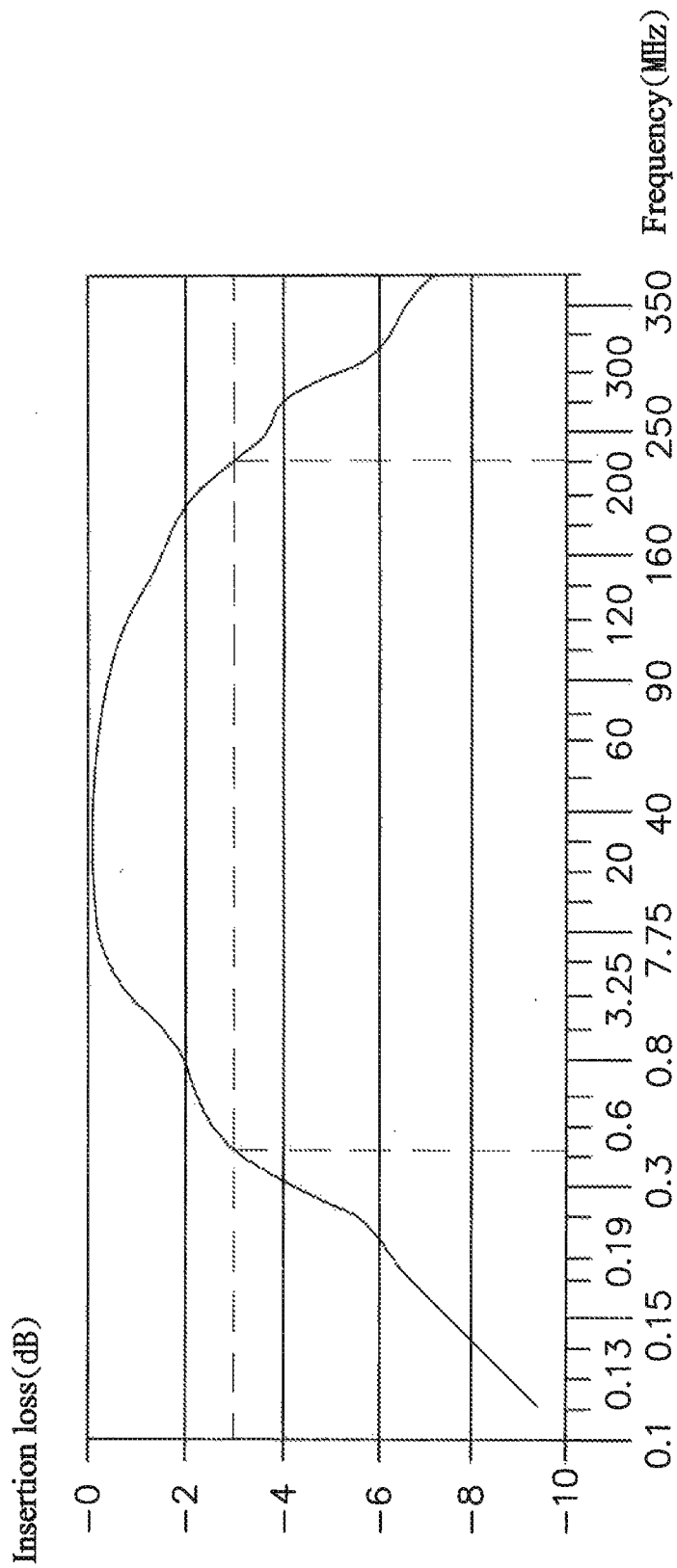
FIG. 7 is a frequency response curve obtained from a conventional transformer.

Referring to FIGS. 1-4, a network signal coupling and EMI protection circuit assembly in accordance with the present invention is shown. As illustrated, the network signal coupling and EMI protection circuit assembly comprises a network connector 2, a network-on-chip 3, a circuit board 4, and a processing circuit 1 installed in the circuit board 4 and electrically coupled between the network connector 2 and the network-on-chip 3. The processing circuit 1 comprises a first connection end 10 electrically coupled to the network connector 2, a second connection end 11 electrically coupled to the network-on-chip 3, a plurality of two-wire channels 12 electrically connected in parallel between the first connection end 10 and the second connection end 11, and a plurality of coupling modules 13 and EMI protection modules 14 respectively installed in the two-wire channels 12 and respectively electrically coupled between the first connection end 10 and the second connection end 11. Each two-wire channel 12 is formed of two wires 121. Each coupling module 13 comprises two first capacitors 131 respectively electrically connected to the two wires 121 of the respective two-wire channel 12. Each EMI protection module 14 comprises two second capacitors 141 that are electrically connected in series between the two wires 121 of the respective two-wire channel 12 with the respective opposite ends thereof electrically connected to a grounding terminal 142.

As stated above, the second capacitors 141 of each EMI protection module 14 have the respective one ends thereof respectively electrically connected to the two wires 121 of the respective two-wire channel 12 and the respective other ends thereof electrically connected to the grounding terminal 142. Further, the first connection end 10 and second connection end 11 of the processing circuit 1 are respectively electrically connected to conducting pins of the network connector 2 and conducting pins of the network-on-chip 3, wherein the number of the two-wire channels 12 of the processing circuit 1 can be, for example, 4; the wires 121 of the two-wire channels 12 of the processing circuit 1 are configured to be $MD0^+/MX0^+$; $MD0^-/MX0^-$; $MD1^+/MX1^+$; $MD1^-/MX1^-$; $MD2^+/MX2^+$; $MD2^-/MX2^-$; $MD3^+/MX3^+$; $MD3^-/MX3^-$. However, this configuration layout is changeable to fit different design requirements.

The aforesaid network-on-chip 3 is a voltage-mode chip adapted to provide a driving voltage to the processing circuit 1. Because signal is subject to variations in voltage during its transmission, each coupling module 13 must provide a resistor for generating a voltage if the processing circuit 1 is used in a current-mode network-on-chip. Using the processing circuit 1 in the aforesaid voltage-mode network-on-chip 3 does not need to install resistors in the coupling modules 13. As stated above, each coupling module 13 of the processing circuit 1 of the network signal coupling and EMI protection circuit assembly in accordance with the present invention comprises two first capacitors 131 respectively electrically connected to the two wires 121 of the respective two-wire channel 12. Subject to the characteristics of the first capacitors 131, supplying a voltage to one end (the first end) of each first capacitor 131 can cause the first end of the respective first capacitor 131 to generate a transient unipolar charge, for example, positive charge, and the other end (the second end) of the respective first capacitor 131 to generate another transient unipolar charge, for example, negative charge. When the supplied voltage is stopped after a predetermined period of time, the other end (the second end) of the respective first capacitor 131 discharges the negative charge through the wires 121 of the respective two-wire channel 12, achieving signal coupling transmission. At the same time, the first capacitor 131 prohibits the signal from passing through the wires 121 of the respective two-wire channel 12 directly, preventing reverse current. However, because the charge and discharge speed of the first capacitors 131 has a great concern with the time constant, the time constant must match the signal cycle so that the charge and discharge time can just let the signal be transmitted in integrity without interruption. Increasing the capacitance of the first capacitors 131 relatively increases the time constant. Preferably, the capacitance of the first capacitors 131 is in the range of 100 µF~0.01 µF, or most preferably 0.1 µF.

In the aforesaid arrangement of the present invention, each first capacitor 131 of each coupling module 13 of the processing circuit 1 of the network signal coupling and EMI protection circuit assembly at one wire 121 of the respective two-wire channel 12 enables the two wires 121 of the respective two-wire channel 12 to be coupled together. The impedance (Z) of the first capacitors 131 is a capacitive reactance of which the unit is ohm ($\Omega$). The capacitive reactance is measured subject to the equation of $Z=\frac{1}{2}(2\pi \cdot f \cdot C)$, in which: f=frequency and its unit is hertz (Hz); C=capacitance and its unit is farad (F). The invention utilizes the characteristics of the first capacitors 131 to isolate electricity and to couple signal. From the above equation, we can know that the capacitive reactance is inversely proportional to the operating frequency and the capacitance. Thus, under the condition that the capacitance of the first capacitors 131 remains unchanged, the capacitance reactance will be relatively reduced and the signal attenuation will also be relatively reduced when the signal frequency is increased, achieving better network linking performance and faster signal transmission speed. By means of the characteristic that the intensity of capacitor rises subject to increase of frequency, capacitors are effective for use in a high-frequency (wideband) network (greater than 1 Gbps) to utilize isolated DC current for creating an electric field induction for coupling signals. Further, the characteristics of the capacitors can also enhance coupling of high-frequency network signals.

Referring to FIGS. 1 and 3 again, the processing circuit 1 and the network-on-chip 3 can be directly installed in the circuit board 4 and then electrically connected to the network connector 2 (see FIG. 1). Alternatively, the processing circuit 1 can be installed in the circuit board 4 and then installed with the circuit board 4 in the network connector 2 that is installed in an external circuit board and electrically connected to a network-on-chip 3 at the external circuit board (see FIG. 3). The processing circuit 1 in either of the aforesaid alternative arrangements can effectively couple signals between the network connector 2 and the network-on-chip 3, and provide a filtration effect. The arrangement of the network connector 2 and the network-on-chip 3 are of the known art and not within the spirit and scope of the invention. Therefore, no further detailed description in this regard is necessary.

Referring to FIGS. 1-4 again, you can clearly see from the drawings that the signal after having been processed through the coupling modules 13 of the processing circuit 1 does not attenuate. The signal is transmitted to the network-on-chip 3 in the original form. Because network signal transmission is exponentially, high intensity (dB) resonant waves will be produced in low frequency 125 MHz and high frequency 250 MHz during the transmission of a network signal. Further, during the transmission of a network signal, other signals may enter, producing noises. These noises must be removed. The second capacitors 141 of the EMI protection modules 14 exhibit a high pass characteristic. Further, lowering the impedance of the second capacitors 141 can relatively increase the filtered signal frequency. Thus, by means of adjusting the impedance of the second capacitors 141, noises can be removed while letting the network signal pass. Subject to the ability of storing electric charges, the second capacitors 141 absorb the lower frequency part of resonant waves in the band, enabling the lower frequency part of resonant waves to be shunted to the grounding terminal 142. Thus, the EMI protection modules 14 can effectively remove low frequency noises. Therefore, when network signals pass through the EMI protection modules 14 toward the network-on-chip 3, high frequency noises and low frequency noises can be effectively removed from the network signals by the EMI protection modules 14, preventing electromagnetic interferences and enhancing signal transmission stability.

Further, the EMI protection modules 14 of the processing circuit 1 can be installed in the channels 12 and electrically coupled between the coupling modules 13 and the first connection end 11 of the processing circuit 1. Alternatively, the EMI protection modules 14 of the processing circuit 1 can be installed in the channels 12 and electrically coupled between the coupling modules 13 and the second connection end 11 of the processing circuit 1.

In actual application, the invention has the advantages and features as follows:

1. The processing circuit 1 of the network signal coupling and EMI protection circuit assembly has a coupling module 13 installed in each two-wire channel 12 between opposing first connection end 10 and second connection end 11 thereof for isolating electricity and coupling network signals, and an EMI protection module 14 with second capacitors 141 installed in each two-wire channel 12 between the first connection end 10 and second connection end 11 for removing a lower frequency part of resonant waves from network signals passing therethrough toward the network-on-chip 3, and therefore the operation of the network signal coupling and EMI protection circuit assembly to transmit network signals to the network-on-chip 3 can prevent electromagnetic interference.

2. Each EMI protection module 14 comprises two second capacitors 141 electrically connected in series to the two wires 121 of the respective two-wire channel 12 with the respective other ends thereof electrically connected to the grounding terminal 142 for absorbing a lower frequency part of resonant waves in the band. This circuit design simply uses regular electronic components that can be directly bonded to a circuit board by an automatic machine without wire winding by labor, facilitating component quality control and mass production to reduce the cost.

In conclusion, the invention provides a network signal coupling and EMI protection circuit assembly using a processing circuit 1 to couple a network connector and a voltage-mode network-on-chip 3. The processing circuit 1 comprises a plurality of two-wire channels 12 connected in parallel between opposing first connection end 10 and second connection end 11 thereof, and a coupling module 13 and an EMI protection module 14 installed in each two-wire channel 12 between the first connection end 10 and the second connection end 11 of the processing circuit 1, wherein each coupling module 13 of the processing circuit 1 comprises two first capacitors 131 respectively electrically connected to the two wires 121 of the respective two-wire channel 12 for isolating electricity and coupling network signals; each EMI protection module 14 comprises two second capacitors 141 electrically connected in series to the two wires 121 of the respective two-wire channel 12 with the respective other ends thereof electrically connected to the grounding terminal 142 for absorbing a lower frequency part of resonant waves in the band to prevent electromagnetic interferences and to enhance network signal transmission stability Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A network signal coupling and EMI protection circuit assembly, comprising a circuit board, a voltage-mode network-on-chip installed in said circuit board and adapted to provide a driving voltage, a network connector, and a processing circuit installed in said circuit board and electrically coupled between said voltage-mode network-on-chip and said network connector and drivable by the driving voltage outputted by said voltage-mode network-on-chip to process network signals, wherein said processing circuit comprises opposing first connection end and second connection end, at least one two-wire channel electrically connected between said first connection end and said second connection end, each said two-wire channel comprising two wires electrically connected in parallel between said first connection end and said second connection end, a coupling module installed in each said two-wire channel for coupling network signals between said voltage-mode network-on-chip and said network connector, each said coupling module comprising two first capacitors respectively installed in the two wires of the respective said two-wire channel, and an EMI protection module installed in each said two-wire channel for filtering resonant waves, each said EMI protection module comprising two second capacitors electrically connected in series between the two wires of the respective said two-wire channel, said second capacitors of each said EMI protection module having respective one ends thereof respectively electrically connected to the two wires of the respective said two-wire channels and respective opposite ends thereof connected in series and grounded, wherein the capacitance of the first capacitors of said coupling modules is in the range of 100 μF~0.01 μF.

2. The network signal coupling and EMI protection circuit assembly as claimed in claim 1, wherein the capacitance of the first capacitors of said coupling modules is 0.1 μF.

3. The network signal coupling and EMI protection circuit assembly as claimed in claim 1, wherein said EMI protection module of said processing circuit is installed in said at least one two-wire channel and electrically coupled between said coupling module and said first connection end of said processing circuit.

4. The network signal coupling and EMI protection circuit assembly as claimed in claim 1, wherein said EMI protection module of said processing circuit is installed in said at least one two-wire channel and electrically coupled between said coupling module and said second connection end of said processing circuit.

5. The network signal coupling and EMI protection circuit assembly as claimed in claim 1, wherein the number of said at least one two-wire channel of said processing circuit is 4; the wires of the two-wire channels of said processing circuit are identified as $MD0^+/MX0^+$; $MD0^-/MX0^-$; $MD1^+/MX1^+$; $MD1^-/MX1^-$; $MD2^+/MX2^+$; $MD2^-/MX2^-$; $MD3^+/MX3^+$; $MD3^-/MX3^-$.

6. A network signal coupling and EMI protection circuit assembly, comprising a network connector, a circuit board installed in said network connector, a voltage-mode network-on-chip adapted to provide a driving voltage, and a processing circuit installed in said circuit board and electrically coupled to said voltage-mode network-on-chip and drivable by the driving voltage outputted by said voltage-mode network-on-chip to process network signals, wherein said processing circuit comprises opposing first connection end and second connection end, at least one two-wire channel electrically connected between said first connection end and said second connection end, each said two-wire channel comprising two wires electrically connected in parallel between said first connection end and said second connection end, a coupling module installed in each said two-wire channel for coupling network signals between said voltage-mode network-on-chip and said network connector, each said coupling module comprising two first capacitors respectively installed in the two wires of the respective said two-wire channel, and an EMI protection module installed in each said two-wire channel for filtering resonant waves, each said EMI protection module comprising two second capacitors electrically connected in series between the two wires of the respective said two-wire channel, said second capacitors of each said EMI protection module each having respective one ends thereof respectively electrically connected to the two wires of the respective said two-wire channels and respective opposite ends thereof connected in series and grounded, wherein the capacitance of the first capacitors of said coupling modules is in the range of 100 μF~0.01 μF.

7. The network signal coupling and EMI protection circuit assembly as claimed in claim 6, wherein the capacitance of the first capacitors of said coupling modules is 0.1 μF.

8. The network signal coupling and EMI protection circuit assembly as claimed in claim 6, wherein said EMI protection module of said processing circuit is installed in said at least one two-wire channel and electrically coupled between said coupling module and said first connection end of said processing circuit.

9. The network signal coupling and EMI protection circuit assembly as claimed in claim 6, wherein said EMI protection module of said processing circuit is installed in said at least one two-wire channel and electrically coupled between said coupling module and said second connection end of said processing circuit.

10. The network signal coupling and EMI protection circuit assembly as claimed in claim 6, wherein the number of said at least one two-wire channel of said processing circuit is 4; the wires of the two-wire channels of said processing circuit are identified as $MD0^+/MX0^+$; $MD0^-/MX0^-$; $MD1^+/MX1^+$; $MD1^-/MX1^-$; $MD2^+/MX2^+$; $MD2^-/MX2^-$; $MD3^+/MX3^+$; $MD3^-/MX3^-$.

* * * * *